Dec. 6, 1966 B. ROSS 3,290,188
EPITAXIAL ALLOY SEMICONDUCTOR DEVICES
AND PROCESS FOR MAKING THEM
Filed Jan. 10, 1964
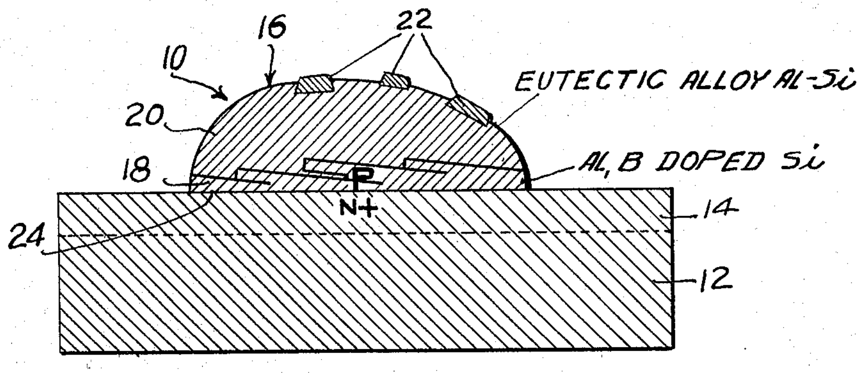
INVENTOR.
BERND ROSS
BY Lyon & Lyon
ATTORNEYS United States Patent Office 3,290,188
Patented Dec. 6, 1966

3,290,188
EPITAXIAL ALLOY SEMICONDUCTOR DEVICES AND PROCESS FOR MAKING THEM

Bernd Ross, Arcadia, Calif., assignor to Hoffman Electronics Corporation, El Monte, Calif., a corporation of California Filed Jan. 10, 1964, Ser. No. 337,013
19 Claims. (Cl. 148—177)

This invention relates to semiconductor devices and more particularly relates to epitaxial alloy semiconductor devices and a process for making them.

In the formation of semiconductor devices such as alloy diodes, a chunk or button of a metal or alloy having a P-type conductivity characteristic when occurring as an atomic impurity in a semiconductor is placed on a wafer or die of semiconductor material of N-type conductivity characteristic. The unit is then heated in a furnace to a temperature above the eutectic temperature of the metal semiconductor mixture with the result that a metal-semiconductor alloy is formed. The unit is then cooled and the excess semiconductor material is deposited out of the alloy back onto the semiconductor surface and forms a regrowth region. Since this deposited semiconductor material is highly doped with the acceptor impurities of the metal, the regrowth region has a P-type conductivity characteristic and forms a rectifying junction with the remainder of the semiconductor die. Contacts can then be made to the alloy region and to the die.

Although this method has ordinarily proven satisfactory for the conventional diode, it has several serious drawbacks when it is desired to use a very thin wafer of semiconductor material or when the semiconductor material must have unusual qualities, as are required, for example, in a tunnel diode. In order for such a diode to have tunneling characteristics it is necessary that the region of the semiconductor die adjacent to the junction have an extremely high impurity concentration in the order of $10^{18}$ to $10^{21}$ per cubic centimeter. Crystals of such a high impurity concentration are difficult and expensive to produce. In addition, some of the desirable contact metals, such as aluminum or an aluminum-boron alloy do not satisfactorily wet a semiconductor material such as silicon. A junction formed in this manner must also be heavily etched to provide it with the proper size and electrical characteristics. As a result of these drawbacks, the manufacture of tunnel diodes is an expensive and slow process and has a relatively low yield of satisfactory units out of any given batch.

According to the present invention, a method of forming semiconductor devices is provided that permits the use of thin semiconductor wafers in the formation of alloy junctions. The process is described in connection with the forming of a tunnel diode, to which it is particularly suited; it should be understood, however, that it may be used in the fabrication of many other semiconductor devices. In the specific example described, the process envisions forming a prealloy of aluminum, boron and silicon, the alloy being on the silicon side of the eutectic point. A portion of this alloy is disposed on a silicon wafer or die and heated to the melting temperature. Since the molten alloy is already saturated with silicon, it will not eat into the silicon die, and thus a very thin substrate or layer thereof may be used. The temperature is then lowered and the excess silcon is deposited out of the alloy onto the surface of the die. As the deposited silicon has a P-type conductivity characteristic and the die has a N-type conductivity characteristic, a P-N rectifying junction is formed. This junction is relatively smooth and requires only light etching. Since the regrowth region is not dissolved from the body of the silicon die, this die can be formed by diffusing a layer of donor impurities into the die to achieve the high concentration necessary.

It is therefore an object of the present invention to provide a process of making semiconductor devices.

It is also an object of the present invention to provide such a process for making an alloy junction with a very thin wafer or layer of semiconductor material.

It is another object of the present invention to provide such a process in which an aluminum-silicon prealloy is deposited on a high impurity concentration region of a silicon wafer.

It is a further object of the present invention to form an epitaxial silicon tunnel diode.

It is a still further object of the present invention to provide an improved semiconductor device.

It is yet another object of the present invention to provide such a device having an alloy junction to a thin wafer or layer of semiconductor material.

It is also an object of the present invention to provide an epitaxial silicon tunnel diode.

These and other objects and advantages of the present invention will become more apparent upon reference to the accompanying description and drawings, in which the single figure is a cross-sectional view of a tunnel diode constructed in accordance with the present invention.

Referring now to the drawing, there is shown a tunnel diode 10 having a semiconductor wafer or die 12 into which has been diffused a donor material such as phosphorus to form an N-type region 14 having an impurity concentration in the order of $10^{18}$ to $10^{21}$ per cubic centimeter. Positioned on the region 14 of the die 12 is a button 16, the lower portion 18 of which is an aluminum and boron doped silicon epitaxy and the upper region of which is an eutectic alloy of aluminum, boron and silicon. A number of chunks 22 of precipitated silicon are scattered throughout the surface of the alloy region 20. The N-type region 14 and the P-type epitaxy 18 form a P-N junction 24 between them.

The process for making this tunnel diode will now be described. A prealloy is formed of aluminum and silicon, the aluminum preferably being doped with a minor percentage of boron. The alloy is brought to the silicon side of the eutectic point and then quickly cooled. A suitable alloy has been found to contain 20% silicon, 79.5% of aluminum, and .5% of boron. This alloy is obtained by heating the silicon aluminum-boron mixture to a temperature of 700° C. If it should be desired that a minor amount of the semiconductor substrate be dissolved and then contribute to the regrowth region, the amount of silicon in the prealloy may be reduced below the eutectic percentage. The prealloy silicon deficiency will be made up from the silicon substrated. After the alloy is cooled, it is broken up into small fragments of the desired size.

One of these alloy fragments is now disposed on a region of a silicon wafer having a satisfactory impurity concentration. The silicon wafer may be produced to have this same high impurity concentration throughout, but preferably is formed by diffusing a donor material into a region of much lower concentration N-type silicon. The unit is now placed in a furnace or other suitable heating device and the temperature of the alloy fragment is raised to 700° C. The unit is now immediately cooled, silicon substrate first.

The cooling of the alloy causes the silicon in excess of the eutectic mixture (about 11.6%) to be deposited out of the alloy, and since the substrate was cooled first, the majority of the silicon forms a highly doped silicon epitaxy of P-type conductivity characteristic on the diffused region of the silicon wafer, thus forming a P-N junction, the impurity concentration in the regions on either side of the junction being high enough to insure tunneling. Contacts may now be made to the alloy button and to the silicon wafer. If desired, cesium fluoride may be used as a flux to insure better wetting of the alloy.

Instead of using a chunk of alloy, a suitable alloy may be disposed on the silicon substrate by flash evaporation. A rapid evaporating technique is necessary in the carrying out of this process in order to prevent fractionation by degrees of volatility of the semiconductor-metal alloy. Various conventional procedures may be utilized for this purpose. After the alloy is evaporated onto the semiconductor substrate, the assembly is heated and cooled as described above.

From the foregoing description, it can be seen that an improved process has been provided for forming semiconductor devices, for example, epitaxial silicon tunnel diodes. The process enables a silicon wafer having a diffused impurity region therein to be used and thus eliminates the need for forming high impurity concentration crystals. The process also reduces the amount of etching necessary and results in better wetting of the semiconductor material by the alloy. This simplification of the fabrication process results in a high yield of tunnel diode structures of suitable electrical parameters. The tunnel junctions of these diodes are smoother and more uniform than those previously available. It should be understood that although only a tunnel diode is illustrated and described, the present invention is useful in any situation that requires the formation of an alloy junction, particularly those where it is desired that none of the semiconductor substrate be dissolved into the alloy. It is also useful in forming alloyed ohmic contacts where none of the semiconductor substrate is to be dissolved. Of course, any suitable metal or alloy may be used in forming the prealloy described, the invention not being limited to aluminum.

The invention may embodied in other specific forms not departing from the spirit or essential characteristics thereof. The present embodiment is therefore to be considered in all respects as illustrative and not restrictive, the scope of the invention being indicated by the appended claims rather than by the foregoing description and all changes which come within the meaning and range of equivalency of the claims are therefore intended to be embraced therein.

I claim:

1. A process of forming a semiconductor device, comprising: forming a prealloy of a semiconductor and a dopant material, disposing a portion of said prealloy on a body of semiconductor material, heating said prealloy portion disposed on said body to a temperature above the eutectic temperature of said prealloy, and cooling said prealloy to deposit an epitaxial layer of the semiconductor material precipitated from said prealloy onto said body of semiconductor material.

2. A process of forming a semiconductor device, comprising: forming a prealloy of a semiconductor material and a material of one conductivity type when occurring as an atomic impurity in a semiconductor material, the composition of said alloy being on the semiconductor material side of the eutectic mixture, disposing a portion of said prealloy on a body of semiconductor material of the opposite conductivity type, heating said prealloy portion disposed on said body to a temperature above the eutectic temperature of said prealloy, and cooling said prealloy portion to epitaxially deposit a portion of the semiconductor material therein onto said body of semiconductor material thereby forming a junction therebetween.

3. A process of forming a semiconductor device, comprising: forming a prealloy of a semiconductor material and a material of one conductivity type when occurring as an atomic impurity in a semiconductor material, said prealloy having a greater percentage of the semiconductor material than the eutectic percentage, breaking said prealloy up into fragments, positioning one of said fragments on a body of said semiconductor material of the opposite conductivity type, heating said fragment to a temperature above the eutectic temperature of said prealloy, and cooling said fragment to epitaxially deposit a portion of said semiconductor material in said prealloy onto said body of semiconductor material thereby forming a junction therebetween.

4. A process of forming a semiconductor device, comprising: forming a prealloy of a semiconductor material and a material of one conductivity type when occurring as an atomic impurity in a semiconductor material, said prealloy having a greater percentage of the semiconductor material than the eutectic percentage, evaporating a portion of said prealloy onto a body of said semiconductor material of the opposite conductivity type, heating said evaporated alloy portion to a temperature above the eutectic temperature of said prealloy, and cooling said evaporated portion to epitaxially deposit a portion of the semiconductor material therein onto said body of semiconductor material thereby forming a junction therebetween.

5. A process of forming a semiconductor device, comprising: forming a prealloy of silicon and a material of one conductivity type when occurring as an atomic impurity in a semiconductor material, said prealloy having an excess of silicon over the eutectic mixture, rapidly evaporating a portion of said prealloy onto a body of silicon of opposite conductivity type, heating said evaporated alloy portion to a temperature above the eutectic temperature of said prealloy, and cooling said evaporated portion to epitaxially deposit a portion of the semiconductor material therein onto said body of semiconductor material thereby forming a junction therebetween.

6. A process of forming a semiconductor device, comprising: forming a prealloy of silicon and a material of one conductivity type when occurring as an atomic impurity in a semiconductor material, said prealloy having an excess of silicon over the eutectic mixture, breaking said prealloy up into fragments, positioning one of said fragments on a region in a body of silicon, said region being of the opposite conductivity type, heating said fragment to a temperature above the eutectic temperature of said prealloy, and cooling said fragment to deposit an epitaxial layer of silicon of said one conductivity type onto said region of the opposite conductivity type, thereby forming a junction therebetween.

7. A process of forming a semiconductor diode, comprising: forming a prealloy of silicon and aluminum, said prealloy having a proportion of silicon in excess of the eutectic proportion, breaking said prealloy up into fragments, positioning one of said fragments on a region in a body of silicon, said region having an N-type conductivity characteristic, heating said fragment to a temperature above the eutectic temperature of said prealloy, and cooling said fragment to deposit an epitaxial layer of silicon of P-type conductivity characteristic onto said region of N-type conductivity characteristic to form a P-N junction therebetween.

8. A process of forming a tunnel diode, comprising: forming a prealloy of silicon and a material of one conductivity type when occurring as an atomic impurity in a semiconductor material, said prealloy having an excess of silicon over the eutectic mixture, breaking said prealloy up into fragments, positioning one of said fragments on a body of silicon of the opposite conductivity type, said body having an impurity concentration sufficient to permit tunneling, heating said fragment to a temperature above the eutectic temperature of said prealloy, and cooling said fragment to deposit an epitaxial layer of silicon of said one conductivity type onto said body of silicon of the opposite conductivity type, thereby forming a junction therebetween.

9. A process of forming a tunnel diode, comprising: forming a prealloy of silicon and aluminum, said prealloy having a proportion of silicon in excess of the eutectic proportion, breaking said prealloy up into fragments, positioning one of said fragments on a region in a body of silicon, said region having an N-type impurity concentration of a magnitude sufficient to permit tunneling, heating said fragment to a temperature above the eutectic temperature of said prealloy, and cooling said fragment to deposit an epitaxial layer of silicon of P-type conductivity characteristic onto said region of N-type conductivity characteristic to form a P-N junction therebetween.

10. The process of claim 7 wherein said aluminum is doped with boron.

11. The process of claim 7 wherein said region is formed by diffusing an N-type impurity into said body of silicon.

12. A semiconductor device, comprising a body of semiconductor material, an epitaxy of a semiconductor material deposited on said body, and a body of an alloy positioned on said epitaxy, said alloy having as constituents a dopant material and the semiconductor material of said epitaxy.

13. A semiconductor device, comprising: a body of semiconductor material, at least a portion of said body being of a first conductivity type, an epitaxy of a semiconductor material of the opposite conductivity type deposited on said portion and forming a junction therewith, and a body of an alloy positioned on said epitaxy, said alloy having as constituents a material of said opposite conductivity type when occurring as an atomic impurity in a semiconductor material and the semiconductor material of said epitaxy.

14. A semiconductor device, comprising: a body of silicon, at least a portion of said body being of a first conductivity type, an epitaxy of silicon of the opposite conductivity type deposited on said portion and forming a junction therewith, and a body of an alloy positioned on said epitaxy, said alloy having as constituents a material of said opposite conductivity type when occurring as an atomic impurity in a semiconductor material and silicon.

15. A semiconductor device, comprising: a body of silicon, at least a portion of said body having an N-type conductivity characteristic, said portion having a flat surface, an epitaxy of silicon of the P-type conductivity characteristic deposited on said surface and forming a P-N junction with said portion, and a body of an alloy positioned on said epitaxy, said alloy having as major constituents aluminum and silicon.

16. A tunnel diode, comprising: a body of semiconductor material, at least a portion of said body being of a first conductivity type, said portion having an impurity concentration sufficient to permit tunneling, an epitaxy of a semiconductor material of the opposite conductivity type deposited on said portion and forming a junction therewith, said epitaxy having an impurity concentration sufficient to permit tunneling, and a body of an alloy positioned on said epitaxy, said alloy having as constituents a material of said opposite conductivity type when occurring as an atomic impurity in a semiconductor material and the semiconductor material of said epitaxy.

17. A tunnel diode, comprising: a body of silicon, at least a portion of said body being of a first conductivity type, said portion having an impurity concentration sufficient to permit tunneling and having a flat surface, an epitaxy of silicon of the opposite conductivity type deposited on said surface and forming a junction with said portion, said epitaxy having an impurity concentration sufficient to permit tunneling, and a body of an alloy positioned on said epitaxy, said alloy having as constituents a material of said opposite conductivity type when occurring as an atomic impurity in a semiconductor material and silicon.

18. A tunnel diode, comprising: a body of silicon, at least a portion of said body having an N-type impurity concentration of a magnitude sufficient to permit tunneling, said portion having a flat surface, an epitaxy of silicon of P-type conductivity characteristic deposited on said surface and forming a P-N junction with said portion, said epitaxy having an impurity concentration sufficient to permit tunneling, and a body of an alloy of silicon and aluminum positioned on said epitaxy.

19. An epitaxial alloy tunnel diode, comprising: a body of silicon, said body having a diffused surface region having an N-type impurity concentration of a magnitude sufficient to permit tunneling, an epitaxy of silicon of P-type conductivity characteristic deposited on said surface region and forming a P-N junction therewith, said epitaxy having an impurity concentration sufficient to permit tunneling, and a body of an alloy of silicon and aluminum positioned on said epitaxy.

References Cited by the Examiner

UNITED STATES PATENTS

| | | | |
|---|---|---|---|
| 3,013,910 | 12/1961 | Dehmelt et al. | 148—185 |
| 3,100,166 | 8/1963 | Marinace et al. | 148—175 |
| 3,105,177 | 9/1963 | Aigrain et al. | 148—185 |

HYLAND BIZOT, *Primary Examiner.*

R. O. DEAN, *Assistant Examiner.*